United States Patent [19]

Hatanaka

[11] Patent Number: 4,799,013
[45] Date of Patent: Jan. 17, 1989

[54] METHOD FOR DETECTING AND PROCESSING MAGNETIC RESONANCE SIGNALS

[75] Inventor: Masahiko Hatanaka, Ootawara, Japan

[73] Assignee: Kabushiki Kaishi Toshiba, Kawasaki, Japan

[21] Appl. No.: 147,157

[22] Filed: Jan. 21, 1988

[30] Foreign Application Priority Data

Jan. 26, 1987 [JP] Japan ................................. 62-15727

[51] Int. Cl.$^4$ ............................................. G01R 33/20
[52] U.S. Cl. ...................................... 324/312; 324/309
[58] Field of Search ....................... 324/309, 312, 307; 364/414

[56] References Cited

U.S. PATENT DOCUMENTS 4,649,346  3/1987  Yeung et al. ...................... 324/312
4,701,709 10/1987  Yamamoto et al. ................ 324/312

OTHER PUBLICATIONS

Hoult, D. I., "A Fourier Analyzer For Nuclear Magnetic Resonance", J. Of Magnetic Resonance, vol. 9, No. 2, Feb. 1973.

Primary Examiner—Stewart J. Levy
Assistant Examiner—Kevin D. O'Shea
Attorney, Agent, or Firm—Foley & Lardner, Schwartz, Jeffery, Schwaab, Mack, Blumenthal & Evans

[57] ABSTRACT

First and second MR (magnetic resonance) echo signals are detected from the subject by means of a spin echo method. These MR echo signals have been provided with different phase encoding data by applying the gradient magnetic fields. As a result, first and second MR echo signal data are acquired from a single Fourier plane. These MR echo signal data are amplitude-corrected and phase-corrected. Then, they are subjected to Fourier transform, thereby forming an MR image of the subject within a short time.

6 Claims, 10 Drawing Sheets

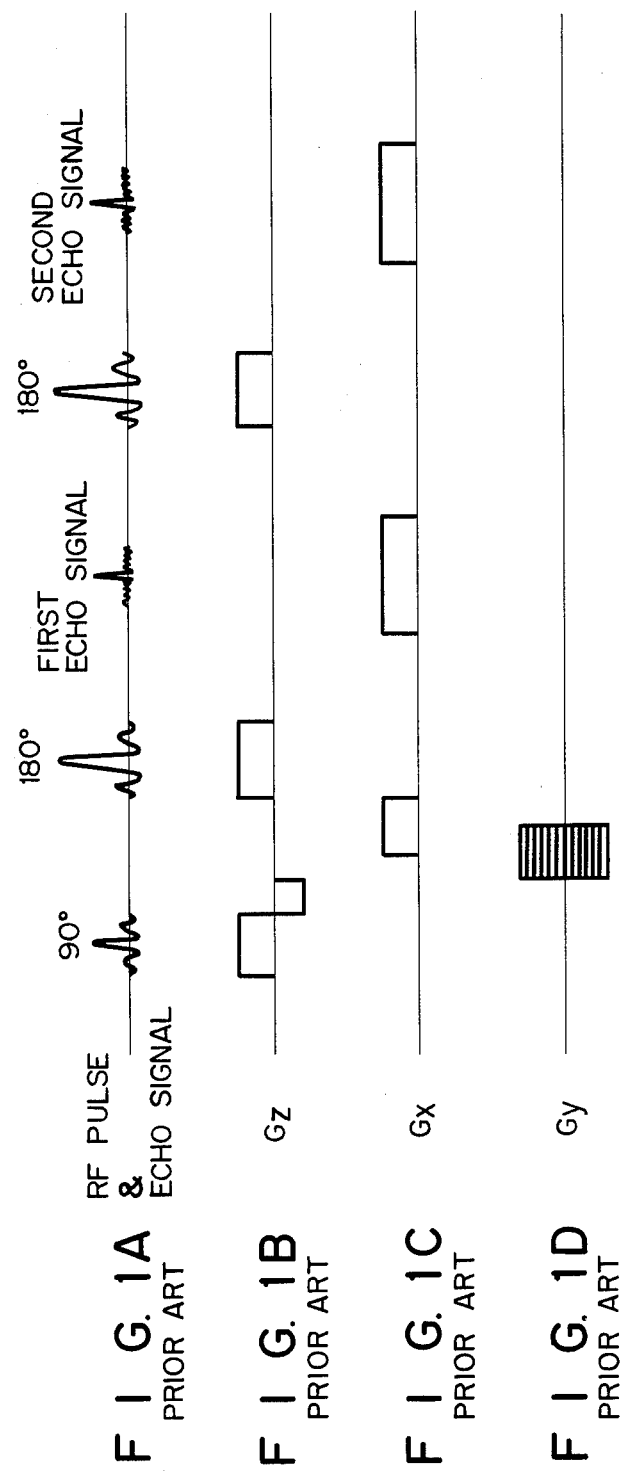

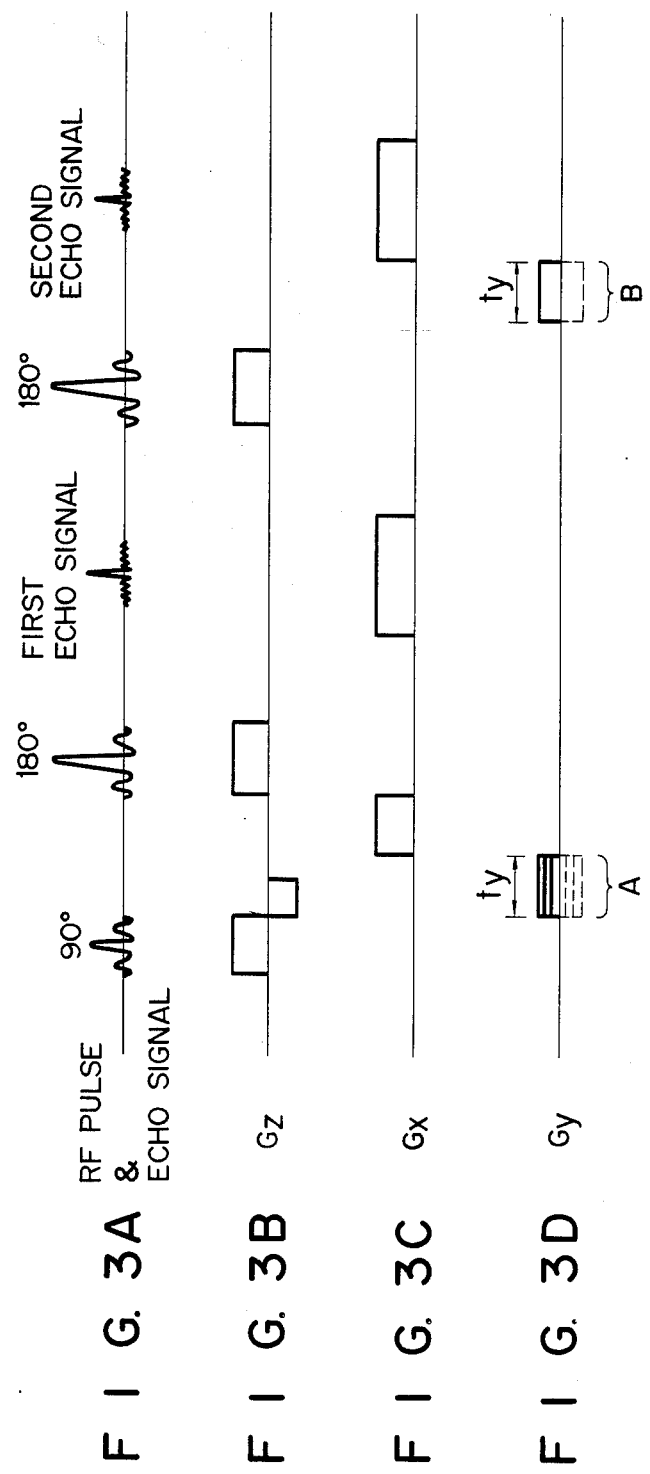

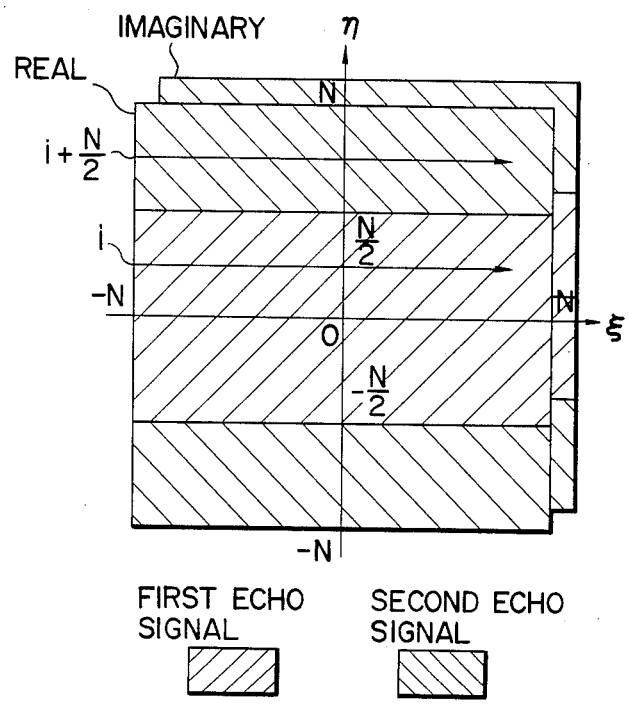
F I G. 4

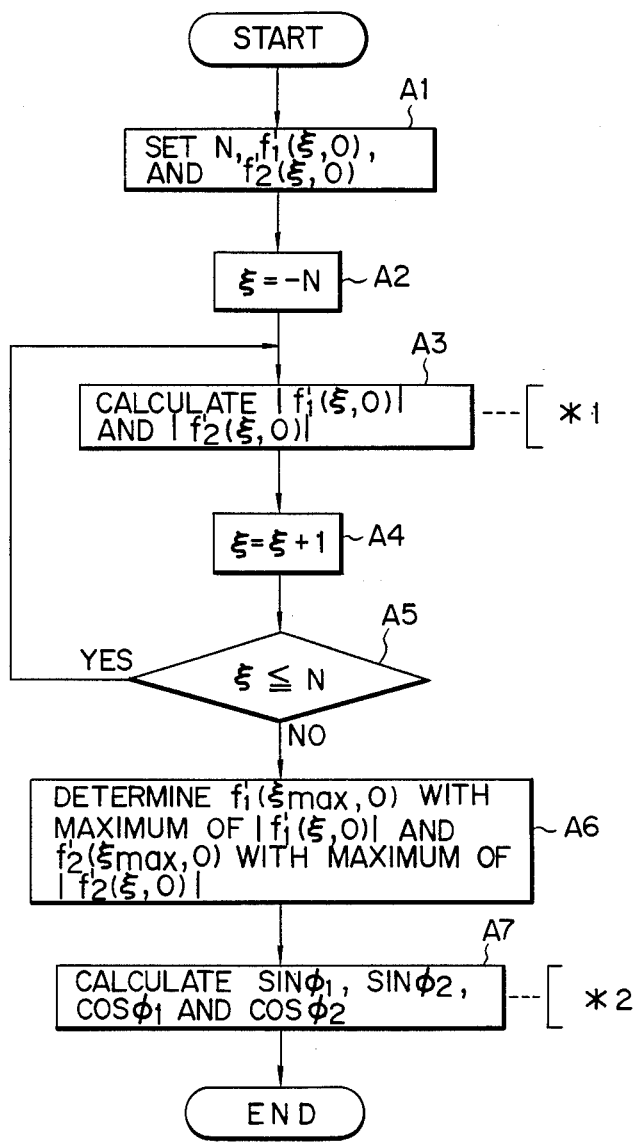
F I G. 5A

F I G. 5B $*1 \begin{cases} |f'_1(\xi,0)| = \sqrt{\{Re(f'_1(\xi,0))\}^2 + \{Im(f'_1(\xi,0))\}^2} \\ |f'_2(\xi,0)| = \sqrt{\{Re(f'_2(\xi,0))\}^2 + \{Im(f'_2(\xi,0))\}^2} \end{cases}$ $*2 \begin{cases} SIN\phi_1 = \dfrac{Im(f'_1(\xi_{max},0))}{|f'_1(\xi_{max},0)|} \\ \\ SIN\phi_2 = \dfrac{Im(f'_2(\xi_{max},0))}{|f'_2(\xi_{max},0)|} \\ \\ COS\phi_1 = \dfrac{Re(f'_1(\xi_{max},0))}{|f'_1(\xi_{max},0)|} \\ \\ COS\phi_2 = \dfrac{Re(f'_2(\xi_{max},0))}{|f'_2(\xi_{max},0)|} \end{cases}$

F I G. 5C

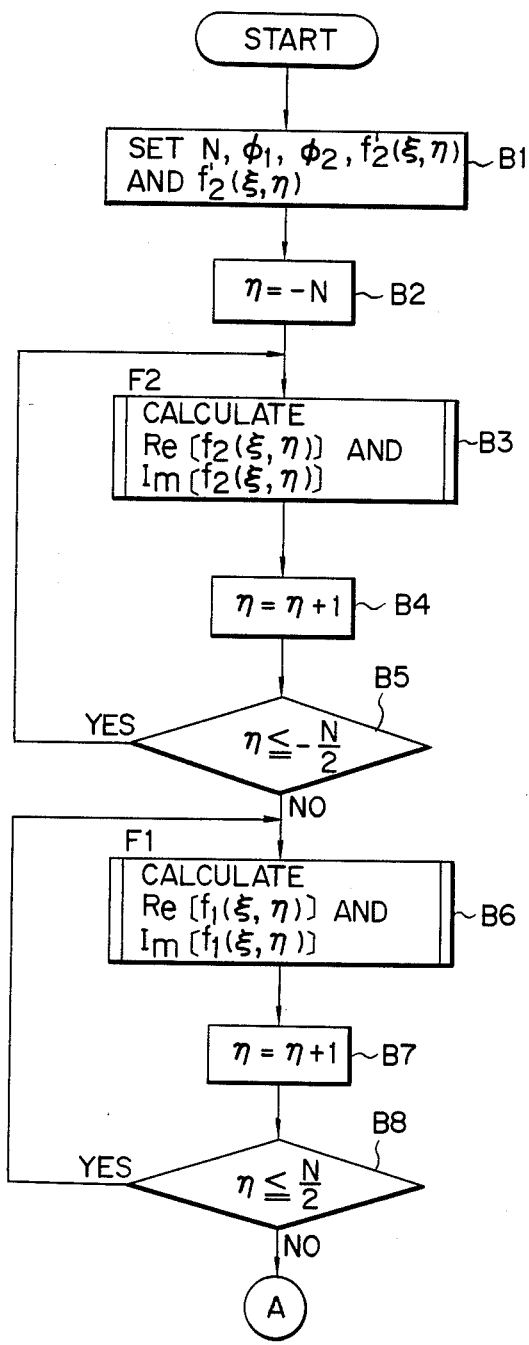
F I G. 6A

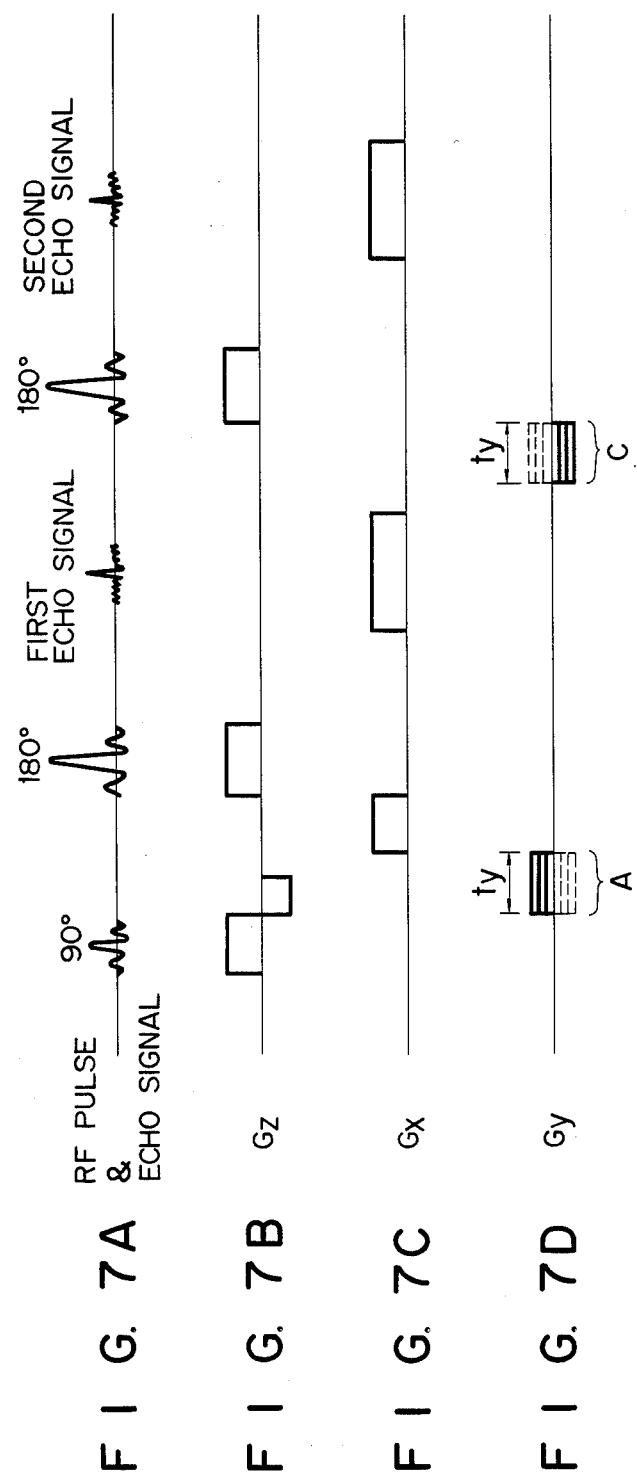

METHOD FOR DETECTING AND PROCESSING MAGNETIC RESONANCE SIGNALS

BACKGROUND OF THE INVENTION

The present invention relates to a method for detecting and processing magnetic resonance (MR) signals, wherein different phase encoding data items are provided to a plurality of MR echo signals generating by magnetic resonance within a subject, thereby to shorten the time required for scanning a subject.

Conventionally, to form a tomographic image of a subject, MR signals generating by the magnetic resonace caused within the subject are processed by means two-dimensional Fourier transform. Each MR echo signal can be given:

$$f(\xi,\eta) = \int\int I(x,y) \exp(j(\xi x + \eta y)) dx dy \quad (1)$$

where $$\xi = \gamma \cdot Gx \cdot tx$$

$$\eta = \gamma \cdot Gy \cdot ty$$

In the above equations, $\gamma$ is the gyromagnetic ratio, Gx is the intensity of the gradient magnetic field in the x direction, Gy is the intensity of the gradient magnetic field in the y direction, tx is the time period during which the magnetic field is maintained at Gx, ty is the time period during which the magnetic field is maintained at Gx, and I(x,y) is the spin density distribution in a slice within the subject. Hence, MR echo signal $f(\xi,\eta)$ is expressed as the product of (Gx, Gy) and (tx, ty). To form a tomogram of the slice, MR echo signals reflected to $(\xi,\eta)$, generally called "Fourier plane" are acquired and subjected to the two-dimensional Fourier transform which is given:

$$I(x,y) = \int\int f(\xi,\eta) \exp(-j(\xi x + \eta y)) d\xi d\eta \quad (2)$$

As is shown in FIGS. 1A to 1D, a 90°-pulse and gradient magnetic field Gz are used to select a desired slice portion of the subject and excite the spinning nuclei existing in this portion of the subject, whereas a 180°-pulse and gradient magnetic field Gx are used to acquire an MR echo signal representing an excited spinning nucleus. The frequency components of the MR echo signal determined by the distribution of the nuclear magnegic moment in the x direction. Gradient magnetic field Gz and gradient magnetic field Gx, which intersects at right angles with gradient magentic field Gy, are used to gradually change the amplitude of field Gy from a negative value to a positive value, thereby to provide phase-encoding information.

Every time the spinning nuclei excite by application of a 90°-pulse, the amplitude of gradient magnetic field Gy is changed from −N to N, as is shown in FIGS. 2A and 2B, thereby acquiring first and second echo signals. The spinning nuclei are excited 2N +1 times, whereby MR echo siganls are acquired. These MR echo signals are subjected to the two-dimensional Fourier transform, thereby to form two MR images.

The conventional image-forming method described above requires a relatively long scanning time since two MR echo signal data concerning two Fourier planes are acquired by exciting the spinning nuclei, 2N +1 times, to form a tomographic image of the subject. Consequently, it takes a long period of time to form a tomographic image of one slice. Therefore, it is desired that a method be taken to shorten the scanning time.

SUMMARY OF THE INVENTION

It is an object of the present invention to provide a method for detecting and processing MR signals, wherein different phase encoding data items are provided to a plurality of MR echo signals generated by the magnetic resonace caused within a subject, thereby to shorten the scanning time required for obtaining a tomographic image of the subject.

According to the present invention, there is provided a method for detecting and processing MR signals, the method comprising the steps of: detecting a plurality of magnetic resonance echo signals by providing different phase encoding data to the magnetic resonance echo signals; correcting the amplitudes and phases of the magnetic resonance echo signals providing with the different phase encoding data, by using magnetic resonance echo signals when phase encoding data is 0; and performing Fourier transform on the magnetic resonance echo signals whose amplitudes and phases have been corrected.

BRIEF DESCRIPTION OF THE DRAWINGS

FIGS. 1A to 1D are views showing a conventional pulse sequence for acquiring MR echo signal data;

FIGS. 3A to 3D are views showing a pulse sequence for acquiring MR echo signal data according to one embodiment of the present invention;

FIG. 4 is a view showing acquisition of MR echo signal data on a Fourier plane in the pulse sequence shown in FIGS. 3A to 3D;

FIG. 5A to 5C are flow charts of the processing of phase correction I of MR echo signal data;

FIGS. 6A to 6D are flow charts of the processing of phase correction II of MR echo signal data; and FIGS. 7A to 7D are views showing a pulse sequence for acquiring MR echo signal data according to another embodiment of the present invention.

DETAILED DESCRIPTION OF THE PREFERRED EMBODIMENT

Figure 2B:
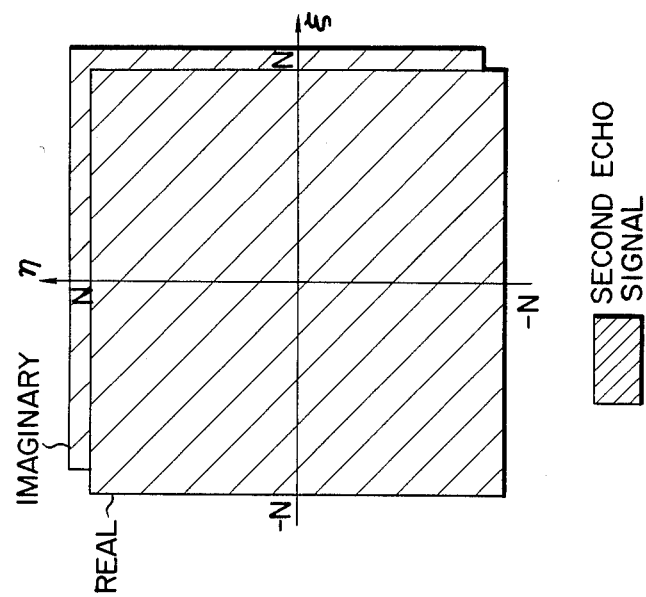
FIGS. 2A and 2B are views showing acquisition of MR echo signal data on a Fourier plane in the pulse sequence shown in FIGS. 1A to 1D.
Figure 2A:
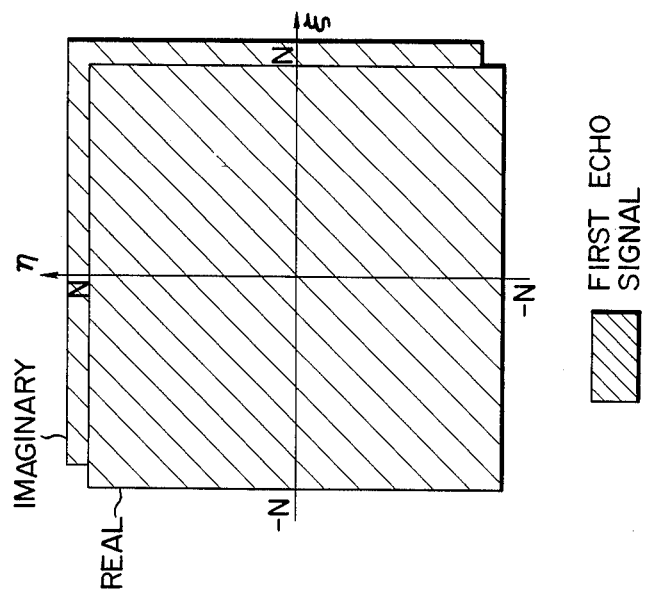

The embodiment of the present invention will be now described with reference to the accompanying drawings.

Referring to FIGS. 3A to 3D, a 90° pulse and gradient magnetic field Gz are used to selectively excite a slice perpendicular to the z axis. Gradient magnetic field Gx is used to acquire an excited spin as MR echo signal data. The amplitude of gradient magnetic field Gy perpendicular to Gz and Gx is sequentially changed to provide phase encoding data.

At portion A of gradient magnetic field Gy, after excitation by a 90 pulse, the amplitude of Gy is changed from −N/2 to N/2. FIG. 4 shows an orthogonal coordinate system $(\xi,\eta)$ on a Fourier plane First MR echo signal data are acquired for $\eta$ from $(-N/2)ty$ to $(N/2)ty$. At portion B, gradient magnetic field Gy having an amplitude of $\pm(N/2)$ is constantly applied to obtain second MR echo signal data More specifically, when a positive gradient magnetic field is applied to portion A, a positive gradient magnetic field having the maximum amplitude +N/2 of the positive magnetic field applied to portion A is applied to portion B. When a negative gradient magnetic field is applied to portion A, a negative gradient magnetic field having the maximum amplitude $-N/2$ of the negative magnetic field applied to portion A is applied to portion B.

As a result, gradient magnetic field i ($1 \leq i \leq N/2$: portion A) provided to the first MR echo signal and gradient magnetic field N/2 (portion B) applied before the acquisition of the second MR echo signal are added, and the (i+N/2)th phase encoding data is provided to the second MR echo signal This will be considered using the Fourier plane shown in FIG. 4. When $\eta$ in the first MR echo signal is changed from $(-N/2)ty$ to $(N/2)ty$, $\eta$ in the second MR echo signal is changed from $-Nty$ to $\{(-N/2)-1\}ty$ and from $\{(N/2)+1\}ty$ to Nty. In other words, with the first and second MR echo signals, MR echo signal data corresponding to the entire Fourier plane can be obtained by excitation of N+1 times. When two-dimensional Fourier transform is performed using the obtained MR echo signal data, an MR image is reconstructed.

The scanning time required for obtaining MR image will be compared with that of a conventional case as follows. When the repetition interval and the number of excitation are set to 2 sec and 2 times, respectively, and image reconstruction using MR echo signal data of 256×256 matrix is to be performed, the following scanning time is obtained:

Conventional scanning time
  2 (sec)×256 (the number of phase encoding)×2 (the number of excitation)=17 (minutes)

Scanning time of the present invention
  2 (sec)×128 (the number of phase encoding)×2 (the number of excitation)=8.5 (minutes)

In this manner, the scanning time of the present invention is about a half that of the conventional case.

The first and second MR echo signals include the same position information. However, the amplitude of the first MR echo signal is different from that of the second MR echo signal depending on the spin-spin relaxation time. As a result, the discontinuity of the amplitude occurs at positions of $\eta = \pm(N/2)ty$ corresponding to the boundary between the area of the first MR echo signals and that of the second MR echo signals on the Fourier plane shown in FIG. 4, and the image quality is degraded. To this evaluation, the following amplitude correction is performed.

First, the phase encoding gradient magnetic fields applied before detection of the first and second MR echo signals are set to 0, respectively, for obtaining amplitudes $A_1$ and $A_2$ of these two MR echo signals. Subsequently, all the data of the second MR echo signal is multiplied by $A_1/A_2$. The degradation in image quality can thus be prevented.

An MR echo signal can be theoretically expressed as equation (1). In practice, however, phase shift $\phi$ is present depending on the performance of the actual MRI apparatus, the pulse sequence, the object under examination, and so on. Therefore, equation (1) is modified as follows:

$$f'(Y,\eta) = \int\int I(x,y)\exp(j(\xi x + \eta y + \phi))dxdy \quad (1)'$$

Phase shift $\phi$ often has different values $\phi_1$ and $\phi_2$ in the first and second MR echo signals, and accordingly a large phase shift occurs at the positions of $\eta = \pm(N/2)ty$, i.e., the boundary between the area of the first MR echo signals and that of the second MR echo signals on the Fourier plane shown in FIG. 4. An artifact on the obtained image is caused by the discontinuity of the phase, thus degrading the image quality.

To prevent the discontinuity, using MR echo signal data obtained when the phase encoding gradient magnetic field is 0, phase correction for obtaining phase shifts $\phi_1$ and $\phi_2$ is performed.

Phase correction consists of phase correction I for obtaining a phase shift and phase correction II for removing the phase shift. Phase correction is performed for MR echo signal data in the same manner.

Phase corrections I and II will be described with reference to the flow charts of FIGS. 5A to 5C and 6A to 6D.

In phase correction I, phase shift $\phi$ is calculated using an MR echo signal which is obtained when the amplitude of the phase encoding gradient magnetic field is 0 ($\eta = 0$).

When $\eta = 0$ in equation (1), that is, when the amplitude of the phase encoding gradient magnetic field is 0, $$f'(\xi,0) = \int\int I(x,y)\exp(j(\xi x + \phi))dxdy \quad (3)$$

Since $\xi = 0$ when $tx = 0$, $\phi$ can be obtained by the following equation:

$$\phi = \tan^{-1}\{\mathrm{Im}[f'(0,0)]/\mathrm{Re}[f'(0,0)]\} \quad (4)$$

When a point of $\xi = 0$ is obtained from actually acquired MR echo signal $f'(\xi,0)$, phase shift $\phi$ is calculated by using equation (4).

The absolute value of equation (3) will be obtained:

$$\begin{aligned}|f'(\xi,0)| &= |\int\int I(x,y)\exp(j\xi x)dxdy \cdot \exp(j\phi)| \\ &= |\int\int I(x,y)\exp(j\xi x)dxdy| \\ &= |f(\xi,0)|\end{aligned} \quad (5)$$

Thus, the absolute value does not depend on phase shift $\phi$.

$|f'(\xi,0)|$ becomes a maximum value when $\xi = 0$, that is, when $tx = 0$. Actually, however, an shift occurs due to the phase shift. Therefore, a maximum value of $|f'(\xi,0)|$ is obtained and the corresponding time is determined as the position of $tx = 0$. Note that reference symbol Im is an imaginary part and Re is a real part.

Referring to FIG. 5, in step A1, parameter N indicating the number of MR echo signal data, first MR echo signal $f_1'(\xi,0)$ and second MR echo signal $f_2'(\xi,0)$ which are obtained when the phase encoding gradient magnetic field is 0, are set, respectively. In step A3, the absolute values of first MR echo signal $f_1'(\xi,0)$ and second MR echo signal $f_2'(\xi,0)$ are calculated. In steps A2, A4, and A5, the processing of step A3 is performed within the range $\xi$ from $-N$ to $N$.

In step A6, first and second MR echo signals with the maximum value of absolute values calculated in step A3 are obtained, respectively. Using the obtained signals, $\sin\phi_1$, $\sin\phi_2$, $\cos\phi_1$, and $\cos\phi_2$ are calculated (step A7).

A phase shift is obtained by the above processing.

Phase correction II will be described with reference to the flow charts of FIGS. 6A to 6D.

When the amplitude of the phase encoding gradient magnetic field is not 0 ($\eta \neq 0$), $\phi$ is removed from equation (1)' using $\phi$ obtained by equation (4). Equation (1)' is modified and divided into real and imaginary parts as follows:

$$f(\xi,\eta) = Re[f'(\xi,\eta)] + jIm[f'(\xi,\eta)] \quad (6)$$
$$= Fc(\xi,\eta)\cos\phi - Fs(\xi,\eta)\sin\phi +$$
$$j\{Fc(\xi,\eta)\sin\phi + Fs(\xi,\eta)\cos\phi\}$$

$$Fc(\xi,\eta) = \int\int I(x,y)\cos(\xi x + \eta y)dxdy \quad (6)'$$
$$Fs(\xi,\eta) = \int\int I(x,y)\sin(\xi x + \eta y)dxdy$$

When equation (6) is solved by inversion, $Fc(\xi,\eta)$ and $Fs(\xi,\eta)$ is obtained by the following equation:

$$Fc(\xi,\eta) = Re[f'(\xi,\eta)]\cos\phi + \quad (7)$$
$$Im[f'(\xi,\eta)]\sin\phi$$
$$Fs(\xi,\eta) = -Re[f'(\xi,\eta)]\sin\phi +$$
$$Im[f'(\xi,\eta)]\cos\phi$$

$Fc(\xi,\eta)$ and $Fs(\xi,\eta)$ are real and imaginary parts, respectively, of $f(\xi,\eta)$ expressed by equation (1). Using equation (7), first and second MR echo signal data after phase correction are obtained.

Figure 6B:
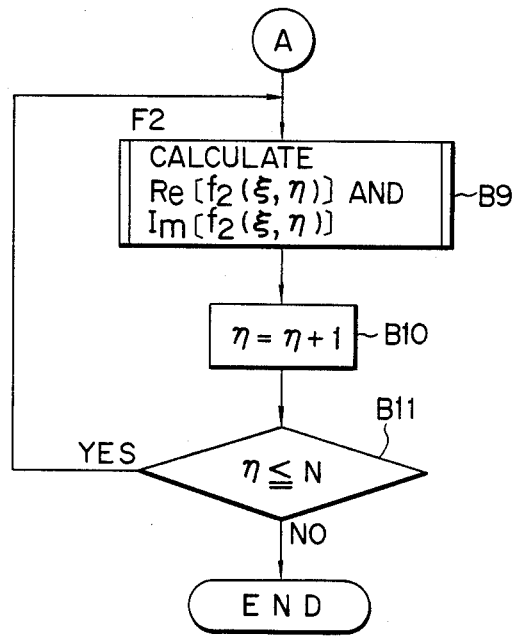

Referring to FIGS. 6A and 6B, in step B1, parameter N indicating the number of MR echo signal data, first MR echo signal $f_1'(\xi,\eta)$, and second MR echo signal $f_2'(\xi,\eta)$ are set. In steps B2 to B11, phase correction is performed for the actually obtained first and second MR echo signals.

In steps B2 to B5, phase correction is performed for second MR echo signals within the range $\eta$ from $-Nty$ to $\{(-N/2)-1\}ty$ in FIG. 4. In steps B6 to B8, phase correction is performed for first MR echo signals within the range $\eta$ from $(-N/2)ty$ to $(N/2)ty$ in FIG. 4. In steps B9 to B11, phase correction is performed for second MR echo signals with the range $\eta$ from $\{(N/2)+1\}ty$ to $Nty$ in FIG. 4.

Figure 6C:
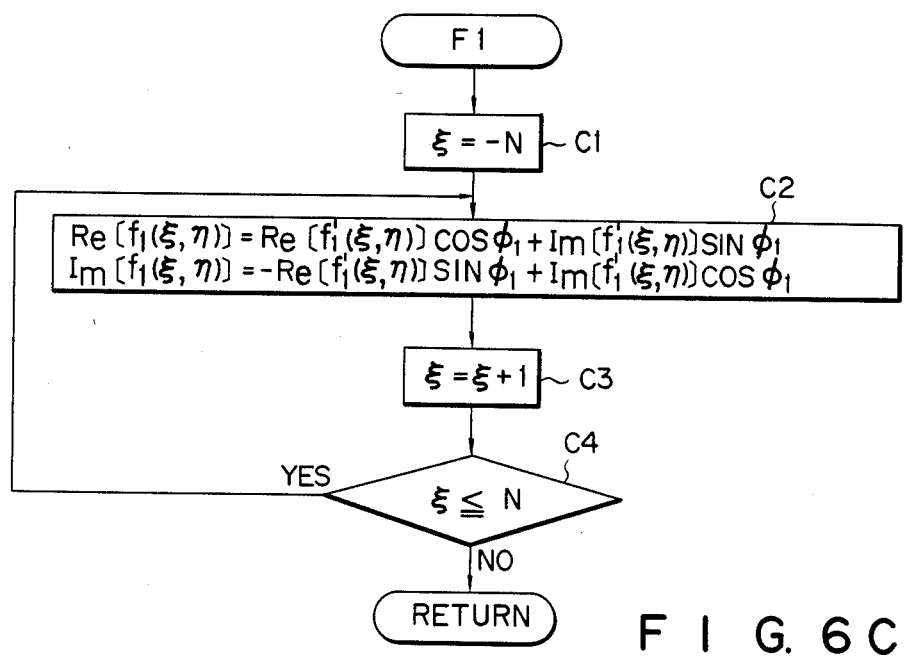
Figure 6D:
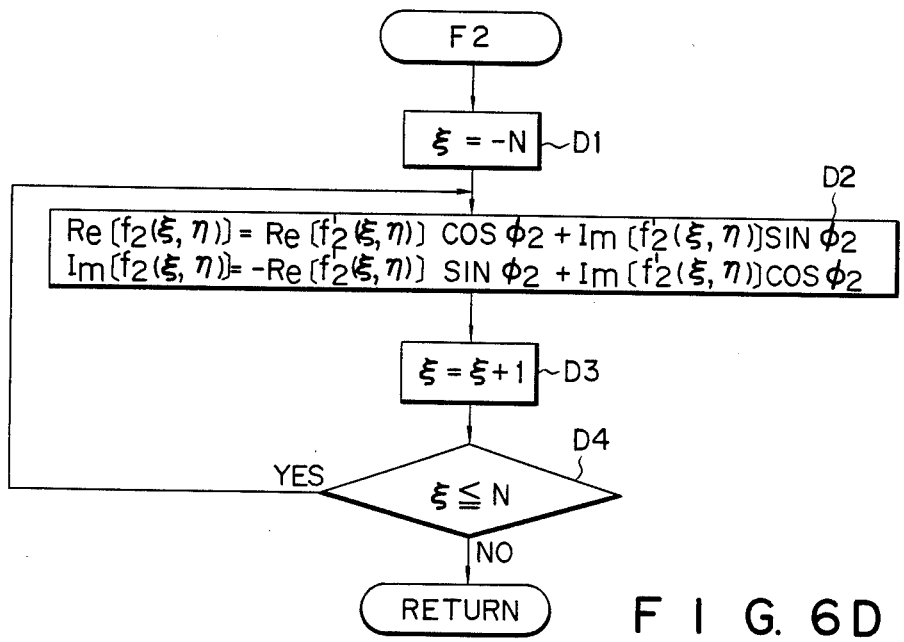

Referring to FIGS. 6C and 6D, steps C1 to C4 are a subroutine of step B6, and steps D1 to D4 are a subroutine of steps B3 and B9. The first and second MR signals and phase shifts $\phi_1$ and $\phi_2$ obtained in phase correction I are used for the calculation of phase correction.

By the above processing, phase-corrected first and second MR echo signals are obtained.

In this manner, phase corrections I and II are performed for the first and second MR echo signals, respectively, phase shifts $\phi_1$ and $\phi_2$ for the first and second MR echo signals are removed, respectively, and then MR echo signal data corresponding to the Fourier plane of FIG. 4 are acquired. As a result, an image having less artifact can be obtained.

This embodiment is described with reference to the pulse sequence of FIGS. 3A to 3D. However, the present invention is not limited to this operation. A similar operation can be obtained by different phase encoding gradient magnetic fields in two MR echo signals, that is, phase encoding gradient magnetic fields with each opposite polarity are applied to portions A and C. In providing the phase encoding data, the amplitude of Gy is changed as in FIGS. 3A to 3D. However, the amplitude Gy can be set a constant and the application time can be changed.

In the above embodiment, two MR echo signals are used. However, the present invention can be similarly applied to two or more MR echo signals. The Fourier transform in the present invention is not limited to two-dimensional Fourier transform and can be extended to three-dimensional Fourier transform.

The present invention is not limited to the above embodiment, and various changes and modifications can be made within the spirit and scope of the invention.

What is claimed is:

1. A method for detecting and precessing magnetic resonance signals generated by applying a static magnetic field and RF pulse to a subject, the method comprising the steps of:
    detecting a plurality of magnetic resonance echo signals by providing a plurality of different phase encoding data to the magnetic resonance echo signals;
    correcting the amplitudes and phases of the magnetic resonance echo signals provided with the different phase encoding data, by using magnetic resonance echo signals when phase encoding data is 0; and
    performing Fourier transform on the magnetic resonance echo signals whose amplitudes and phases have been corrected.

2. A method according to claim 1, wherein the magentic resonance echo signals are acquired at predetermined positions in a Fourier plane.

3. A method according to claim 1, wherein the step of correcting the amplitudes of the magnetic resonance echo signals includes a step of multiplying, by $A_1/A_n$, the amplitude of nth magnetic resohance echo signal provided with a predetermined phase encoding data, where $A_1$ is the amplitude of a first magnetic resonance echo signal when phase encoding data is 0, and $A_n$ is the amplitude of the nth magnetic echo signal when phase encoding data is 0.

4. A method according to claim 1, wherein the step of correcting the phases of the magnetic resonance echo signals includes a step of calculating phase shifts of the magnetic resonance echo signals and a step of acquiring the magnetic resonance echo signals whose phases have been corrected in accordance with the calculated phase shifts.

5. A method according to claim 4, wherein the phase shift of each of the magnetic resonance echo signals is calculated by the following equations:

$$\sin\phi_n = Im[f_n'(\xi max,0)]/|f_n'(\xi max,0)|$$
$$\cos\phi_n = Re[f_n'(\xi max,0)]/|f_n'(\xi max,0)|$$

where $\phi_n$ is the phase shift of an nth magnetic resonance echo signal, $F_n'(\xi max,0)$ is a signal obtained at a point where a maximum absolute value of an nth magnetic resonance echo signal when phase encloding data is 0, Re is a real part, and Im is an imaginary part.

6. A method according to claim 4, wherein the phase of each of the magnetic resonance echo signals is corrected by the following equations:

$$Re[f_n(\xi,\eta)] = Re[f_n'(\xi,\eta)]\cos\phi_n +$$
$$Im[f_n'(\xi,\eta)]\sin\phi_n$$
$$Im[f_n(\xi,\eta)] = -Re[f_n'(\xi,\eta)]\sin\phi_n +$$
$$Im[f_n'(\xi,\eta)]\cos\phi_n$$

where $\phi_n$ is the phase shift of an nth magnetic resonance echo signal, and $f_n'(\xi,\eta)$ is an nth magnetic resonance echo signal provided with a predetermined phase encoding data.

* * * * *